United States Patent [19]

Hite et al.

[11] Patent Number: 4,863,878

[45] Date of Patent: Sep. 5, 1989

[54] METHOD OF MAKING SILICON ON INSALATOR MATERIAL USING OXYGEN IMPLANTATION

[75] Inventors: Larry R. Hite, Dallas; Ted Houston, Richardson; Mishel Matloubian, Dallas, all of Tex.

[73] Assignee: Texas Instruments Incorporated, Dallas, Tex.

[21] Appl. No.: 35,126

[22] Filed: Apr. 6, 1987

[51] Int. Cl.[4] ............... H01L 21/263; H01L 7/54; H01L 21/76

[52] U.S. Cl. ............ 437/026; 148/DIG. 77; 148/DIG. 81; 148/DIG. 118; 148/DIG. 150; 156/613; 437/62; 437/83; 437/82; 437/915; 437/973

[58] Field of Search ............ 148/DIG. 25, 71, 76, 148/77, 81, 90, 128, 152, 150, 118, 33.3; 156/610, 14 615; 357/49, 91; 437/26, 62, 82, 66, 68, 83, 84, 108, 915, 973

[56] References Cited

U.S. PATENT DOCUMENTS

| | | | |
|---|---|---|---|
| 3,622,382 | 11/1971 | Brack et al. | 437/26 |
| 3,707,765 | 1/1973 | Coleman | 437/26 |
| 3,855,009 | 12/1974 | Lloyd et al. | 357/49 |
| 3,895,965 | 7/1975 | MacRae et al. | 437/26 |
| 3,897,274 | 7/1975 | Stehlin et al. | 437/26 |
| 3,976,511 | 8/1976 | Johnson | 437/62 |
| 4,317,686 | 3/1982 | Anand et al. | 357/91 |
| 4,448,632 | 5/1984 | Akasaka | 156/612 |
| 4,465,705 | 8/1984 | Ishihara et al. | 437/26 |
| 4,490,182 | 12/1984 | Scovell | 437/62 |
| 4,579,609 | 4/1986 | Reif et al. | 156/612 |
| 4,593,458 | 6/1986 | Adler | 437/62 |

FOREIGN PATENT DOCUMENTS

| | | | |
|---|---|---|---|
| 0156490 | 10/1979 | Japan | 437/26 |
| 0211749 | 12/1982 | Japan | 437/26 |
| 0193043 | 1/1984 | Japan | 437/26 |
| 0208851 | 11/1984 | Japan | 437/62 |

OTHER PUBLICATIONS

Ghandhi, "VLSI Fabrication Principles", John Wiley and Sons, New York, N.Y. 1983, p. 570.

Primary Examiner—Brian E. Hearn
Assistant Examiner—William D. Bunch
Attorney, Agent, or Firm—Rodney M. Anderson; Leo N. Heiting; Melvin Sharp

[57] ABSTRACT

The described embodiments of the present invention provide a semiconductor on insulator structure providing a semiconductor layer less susceptible to single event upset errors (SEU) due to radiation. The semiconductor layer is formed by implanting ions which form an insulating layer beneath the surface of a crystalline semiconductor substrate. The remaining crystalline semiconductor layer above the insulating layer provides nucleation sites for forming a crystalline semiconductor layer above the insulating layer. The damage caused by implantation of the ions for forming an insulating layer is left unannealed before formation of the semiconductor layer by epitaxial growth. The epitaxial layer, thus formed, provides superior characteristics for prevention of SEU errors, in that the carrier lifetime within the epitaxial layer, thus formed, is less than the carrier lifetime in epitaxial layers formed on annealed material while providing adequate semiconductor characteristics.

10 Claims, 4 Drawing Sheets 4,863,878

METHOD OF MAKING SILICON ON INSALATOR MATERIAL USING OXYGEN IMPLANTATION

The following statement is believed to be true with respect to at least some of the various inventions described in the present application:

This invention was made with Government support under Contract No. DNA001-C-0175 awarded by the Defense Nuclear Agency of the Department of Defense. The Government has certain rights in this invention.

FIELD OF THE INVENTION

The present invention relates to the field of integrated circuit fabrication. More specifically, the present invention relates to the fabrication of semiconductor on insulator structures in integrated circuit fabrication.

BACKGROUND OF THE INVENTION

The use of semiconductor on insulator structures to reduce the susceptibility of integrated circuits using semiconductor on insulator structures to radiation effects is known in the art. Semiconductor on insulator techniques are particularly useful in lowering the single event upset (SEU) rate of digital circuits. SEU errors are, in large part, caused by radiation particles striking the semiconductor material across a depletion boundary. The particle causes random generation of carriers across the depletion boundary and may create enough carriers to alter the electrical state of the device struck.

Semiconductor on insulator structures reduce the effect of radioactive particles by limiting the amount of material from which the charge carriers can be generated and by isolating the active area of the devices from the substrate, reducing the tendency of the radioactive particles to cause permanent shifts in the electrical state of the active device.

FIG. 1A shows the initial steps informing a semiconductor on insulator structure. Silicon substrate 1 is generally an undoped crystalline substrate. Oxygen ions are implanted into the surface of substrate 1 with energy sufficient to cause implantation below crystalline region 5. These ions react with substrate 1 to form silicon dioxide layer 3 with crystalline silicon layer 5 on the surface. The structure of FIG. 1A is then subjected to a high temperature anneal on the order of 1275° C. to anneal the damage to crystalline silicon layer 5 and provide a good base for forming a crystalline epitaxial layer on the surface of crystalline silicon layer 5. The structure of FIG. 1A is subjected to an epitaxial process to grow an epitaxial layer such as epitaxial layer 7 of FIG. 1B. A patterned etch mask is then formed on the surface of epitaxial layer 7 and etching of epitaxial layer 7 using orientation dependent etching is performed to form epitaxial mesa structure 9 as shown in FIG. 1C. Gate oxide layer 11 and gate 13 are then formed and patterned on the surface of mesa structure 9 using techniques well known in the art. Gate 13 and gate insulator layer 11 are then used as an implantation mask for boron ions which are implanted in the mesa structure 9 to form source and drain regions 15 and 17 as shown in FIG. 1D.

The structure of FIG. 1D provides good protection against SEU errors but is still susceptible to radiation effects if a sufficient number of radioactive particles strike the structure of FIG. 1D. Thus, further techniques for reducing the susceptibility of structures such as FIG. 1D are desirable.

SUMMARY OF THE INVENTION

The described embodiments of the present invention provide a semiconductor on insulator structure providing a semiconductor layer less susceptible to single event upset errors. The semiconductor layer is formed by implanting ions which form an insulating layer beneath the surface of a crystalline semiconductor substrate. The remaining crystalline semiconductor layer above the insulating layer provides nucleation sites for forming a crystalline semiconductor layer above the insulating layer. The damage caused by implantation of the ions for forming an insulating layer is left unannealed before formation of the epitaxial crystalline layer. The epitaxial layer, thus formed, provides superior characteristics for prevention of SEU errors, in that the carrier lifetime within the epitaxial layer, thus formed, is less than the carrier lifetime in epitaxial layers formed on annealed material while providing adequate semiconductor characteristics.

BRIEF DESCRIPTION OF THE DRAWINGS

The present invention will be described with reference to the accompanying drawings, wherein.

DETAILED DESCRIPTION OF THE DRAWINGS

FIGS. 2A through 2D are side view schematic drawings depicting processing steps in accordance with one embodiment of the present invention. Although the described embodiment is for the fabrication of a P channel field effect transistor, it should be recognized that any active device presently used in integrated circuitry can be fabricated using the techniques shown. For example, bipolar devices, diodes, resistors, capacitors of all sizes and conductivity types are compatible with the described process. In addition, although the described process uses a silicon substrate with oxygen implants, it is not to be construed as limiting the present invention to silicon device processes. For example, the implantation of aluminum into a Gallium Arsenide substrate may be used to provide a sufficient barrier for formation of semiconductor on insulator devices.

Figure 1A:
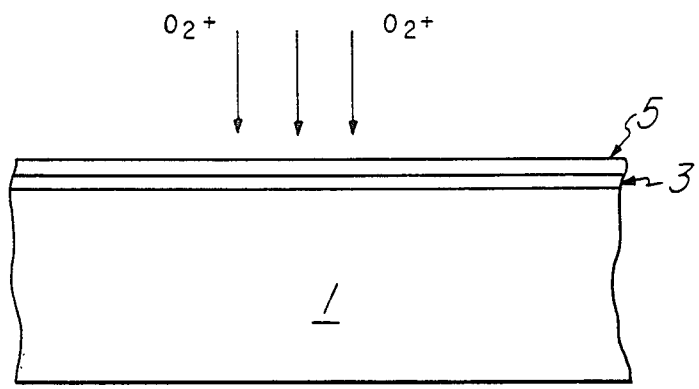
FIGS. 1A through 1D are side view schematic drawings depicting the processing steps used to form a field effect transistor using a semiconductor on insulator process, as known in the prior art.
Figure 1B:
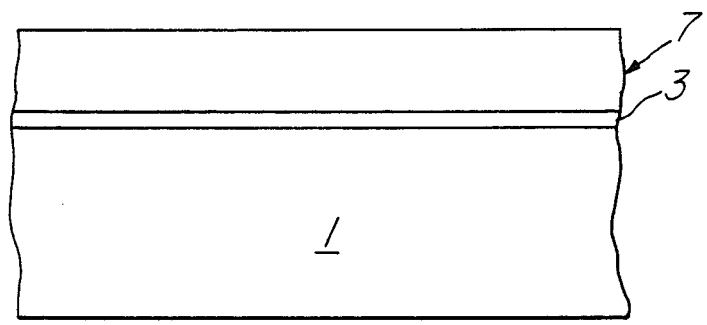
Figure 1C:
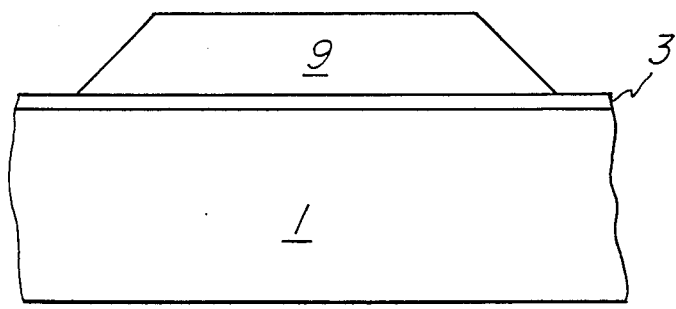
Figure 1D:
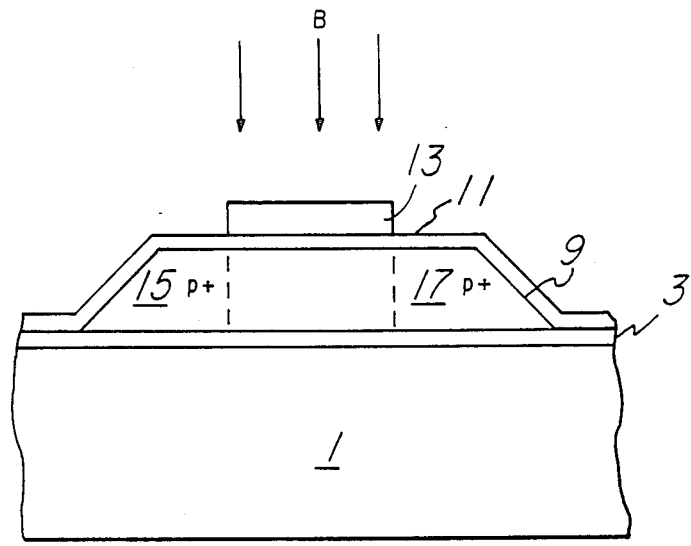
Figure 2A:
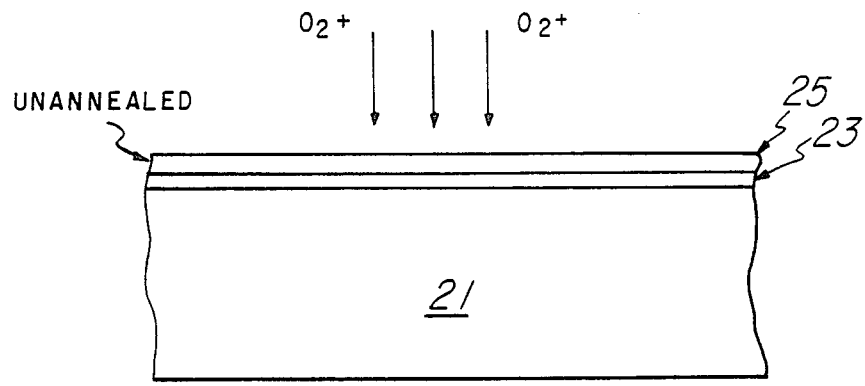
FIGS. 2A through 2D are side view schematic drawings showing one embodiment of the present invention.

FIG. 2A describes the initial steps for fabricating a field effect transistor as shown in this embodiment. Crystalline silicon substrate 21 is usually an undoped substrate, but may be formed using any doping type. An oxygen implant is performed at an energy of approximately 150 keV, but energies as high as 200 KeV are used. The upper energy limit is presently a function of the upper limits of commercially available machinery and not incompatibility with the described process. The density of oxygen ions is approximately $2.2 \times 10^{18}$ ions per centimeter squared, however, densities as low as $1 \times 10^{18}$ ions per centimeter squared have been successfully used. The substrate is maintained at a temperature of approximately 400° to 600° to maintain the crystallinity of the silicon surface. Following this implantation, the prior art shows an annealing step of approximately 1275° C. Using the present technique, this annealing step is omitted. The prior art teaches that omitting this annealing step will provide an epitaxial layer for device fabrication of unacceptable quality. We have discovered that this is incorrect, and in fact, the omission of this annealing step provides advantageous results.

Figure 2B:
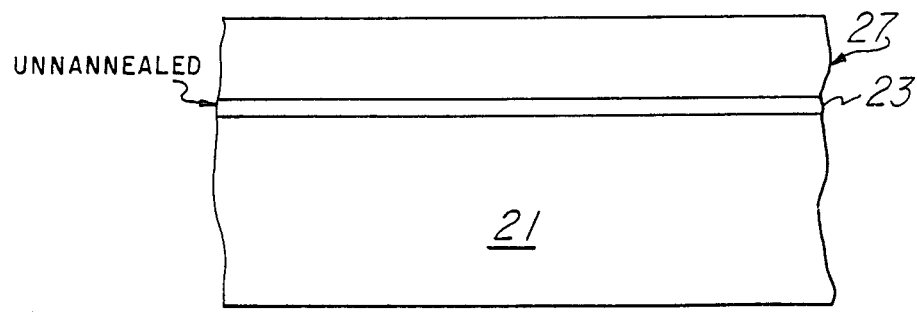

Turning now to FIG. 2B, epitaxial layer 27 is grown by chemical vapor deposition on the surface of the structure of FIG. 2A. This epitaxial layer is grown to a thickness of approximately 2,000 Angstroms to combine with layer 25 of FIG. 2A to form layer 27 of FIG. 2B having a thickness of approximately 3,300 Angstroms.

An etch mask (not shown) is formed and patterned on the surface of epitaxial layer 27 and epitaxial layer 27 is etched using an orientation dependent etch such as a dilute solution of hydrazine, ethylene diamine or potassium hydroxide with isopropyl alcohol or catechol. The resulting structure is mesa 29 as shown in FIG. 2C.

Figure 2C:
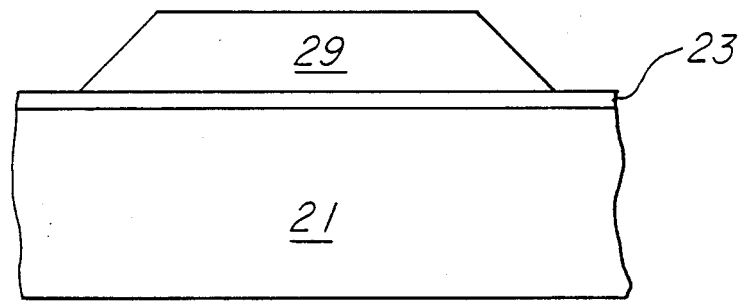
Figure 2D:
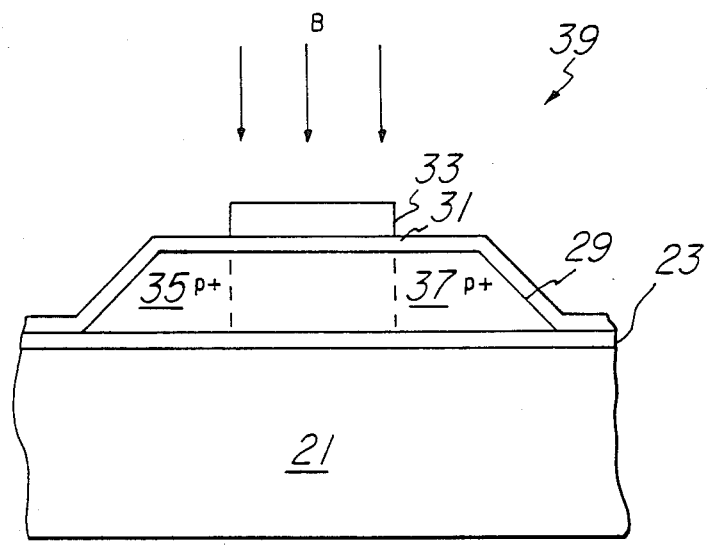

The structure of FIG. 2C is subjected to thermal oxidation in an oxygen ambient at approximately 850° C. for approximately 10 minutes to form a silicon dioxide layer 31 on the surface of mesa structure 29. A polycrystalline silicon layer (not shown) is then formed on the surface of this gate oxide layer to a thickness of approximately 4,500 Angstroms using low pressure chemical vapor deposition. This polycrystalline silicon layer is doped using POCl$_3$ doping at 900° C. for approximately 30 minutes. A photoresist layer is formed and patterned on the surface of the polycrystalline silicon layer to serve as an etch mask for the polycrystalline silicon layer. The polycrystalline silicon layer is then etched using a plasma etching process using an HCl/HBr plasma. The photoresist is removed and the polysilicon layer is used as an implantation mask for an implantation of boron ions at an energy of approximately 20 KeV and a density of approximately $3 \times 10^{15}$ ions per centimeter squared. This ion implantation is then annealed at a temperature of approximately 900° C. in an argon environment for approximately 60 minutes to form source region 35 and drain region 37. The resulting structure is transistor 39, as shown in FIG. 2D.

Figure 3:
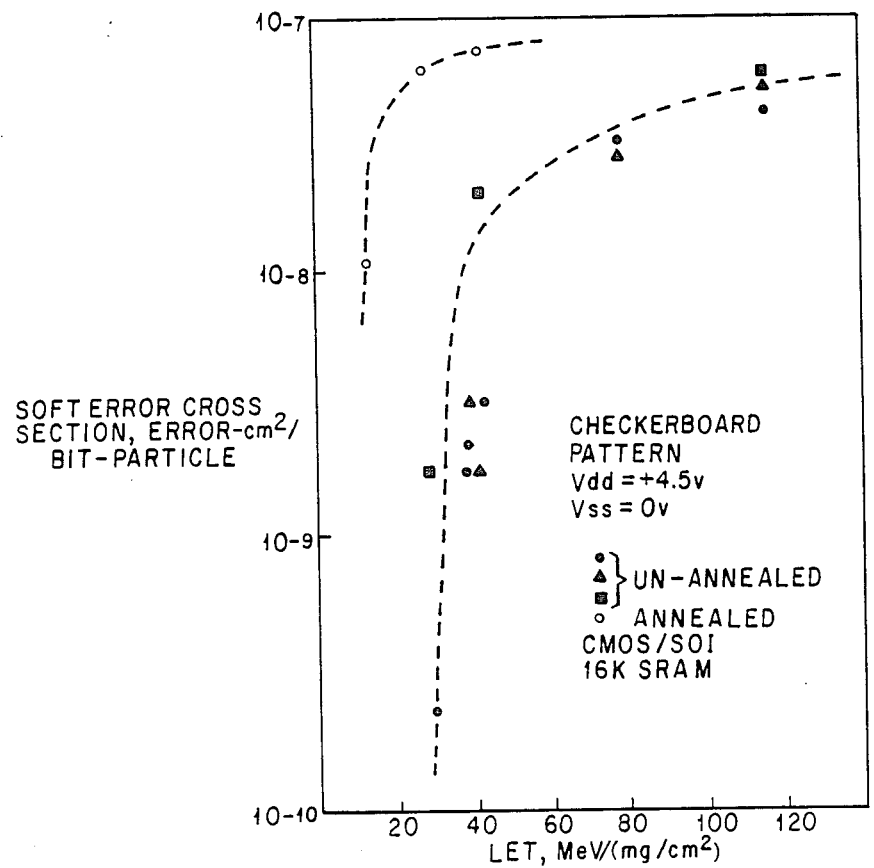
FIG. 3 is a graph showing the improved radiation hardness of the described embodiment over a similar structure formed using prior art techniques.

FIG. 3 is a graph showing the comparison of the soft error rate of a static random access memory fabricated using the prior art and the present invention. LET is linear energy transfer or the rate of energy loss by ionization of an ion particle passing through a semiconductor device.

The above description is provided by way of example and in no way limits the scope of the invention claimed. The scope of the invention is only limited by the claims appended hereto.

TECHNICAL ADVANTAGES

The described embodiment of the present invention provides a semiconductor on insulator structure having improved characteristics. The described structure provides semiconductive material having reduced carrier lifetime thereby reducing the susceptibility of integrated circuitry formed therein to single event upsets caused by radiation striking the semiconductive area.

What is claimed is:

1. A method for forming a semiconductor on insulator structure comprising the steps of:
   providing a semiconductor substrate;
   implanting ions which react with said semiconductor substrate to form an insulating layer, said ions being implanted with a sufficient energy so that an insulating layer is formed beneath the surface of said substrate;
   forming an epitaxial layer on the surface of said substrate after said implantation, without annealing said substrate following said implantation; and
   forming electrical devices in said epitaxial layer.

2. The method of claim 1 wherein said semiconductor substrate comprises silicon.

3. The method of claim 1 wherein said implanted ions are oxygen ions.

4. The method of claim 1 further comprising the step of etching through said epitaxial layer between selected active devices.

5. The method of claim 1 wherein said electrical devices include a field effect transistor.

6. The method of claim 3 wherein said oxygen ions are implanted at an energy level of substantially 150 KeV or higher.

7. The method of claim 3 wherein said oxygen ions are implanted to a density of $1 \times 10^{18}$ ions per square centimeter or higher.

8. The method of claim 1 wherein said semiconductor substrate has a crystalline structure and said crystalline structure is damaged by the steps of implanting ions.

9. A method for forming a semiconductor on an insulator structure comprising the steps of:
   providing a crystalline semiconductor substrate;
   forming an insulating layer within said substrate, said insulating layer formed a distance below a surface of said substrate;
   damaging a region of said crystalline semiconductor substrate, said region lying between said insulating layer and said surface;
   forming an epitaxial layer on said surface of said substrate above said damaged region while said damaged region remains damaged; and,
   forming electrical devices in said epitaxial layer.

10. The method of claim 9 wherein the step of damaging a region comprises:
    implanting ions into said crystalline substrate without annealing said substrate to heal damage caused by said implanting.

* * * * *